United States Patent [19]

Naarmann et al.

[11] 4,440,693
[45] Apr. 3, 1984

[54] PREPARATION OF ELECTRICALLY CONDUCTIVE PRODUCTS

[75] Inventors: Herbert Naarmann, Wattenheim; Klaus Penzien, Frankenthal; Volker Muench; Klaus-Dieter Franz, both of Ludwigshafen, all of Fed. Rep. of Germany

[73] Assignee: BASF Aktiengesellschaft, Fed. Rep. of Germany

[21] Appl. No.: 327,726

[22] Filed: Dec. 4, 1981

[30] Foreign Application Priority Data

Dec. 13, 1980 [DE] Fed. Rep. of Germany ....... 3047085

[51] Int. Cl.$^3$ .................. C07F 00/00; C07F 1/08; C07F 15/02
[52] U.S. Cl. ..................... 260/439 R; 260/429 J; 260/438.1; 260/440; 260/441; 260/446
[58] Field of Search ............ 260/429 J, 438.1, 439 R, 260/440, 441, 446; 252/411

[56] References Cited

U.S. PATENT DOCUMENTS 3,876,675 4/1975 Trofimenko .................. 260/429 J
4,098,807 7/1978 Stone et al. .................. 260/429 J

FOREIGN PATENT DOCUMENTS 1388417 3/1975 United Kingdom .

OTHER PUBLICATIONS

Chem. Abstr., vol. 80, No. 2, Jan. 14, 1974, p. 471, No. 9919r.
Inorg. Nucl. Chem. Lett., 10 (1974), pp. 467–471.
J. Org. Chem. 44 (1979) pp. 1704–1708.

Primary Examiner—Harry Wong, Jr.
Attorney, Agent, or Firm—Keil & Witherspoon

[57] ABSTRACT

A process for the preparation of electrically conductive products which are stable to air and have conductivities greater than $1 \times 10^{-3}$ S/cm, by reacting a cation of a metal of group VII or VIII or of sub-group I of the periodic table with an organic chelating compound to give a metal chelate and oxidizing the latter to form a oxidized product, wherein the organic chelating compound is a 1,9-substituted phenalene of the formula I

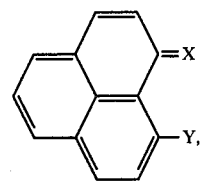

where X is O, NH, S, Se or Te and Y is OH, $NH_2$ or SH. The electrically conductive products are useful for the production of solar cells, the conversion and fixing of radiation, the production of electrical and magnetic switches and the antistatic treatment of plastics.

6 Claims, No Drawings

PREPARATION OF ELECTRICALLY CONDUCTIVE PRODUCTS

The present invention relates to a process for the preparation of electrically conductive products which are stable to air and have conductivities greater than $1\times10^{-3}$ S/cm, by reacting a cation of a metal of group VII or VIII or of sub-group I of the periodic table with an organic chelating compound to give a metal chelate and oxidizing the latter to form the oxidized product.

In such processes, it is necessary first to react a transition metal cation $Me^{n\oplus}$ with an organic chelating compound to give a transition metal chelate having a quasi-onedimensional polymeric structure, before oxidizing the chelate.

The conversion of organo-metallic compounds having a direct metal-metal interaction or metal-ligand-metal bonds into quasi-onedimensional electrically conductive products has been disclosed (cf. M. Harnack, Nachr. Chem. Tech. Lab. 28 (9) (1980), 632).

Examples of known systems of transition metal cations are tetracyanoplatinate(II) complexes, which crystallize in columnar structures with Pt-Pt contacts (cf. Angew. Chem., 81 (1964), 10). Partial oxidation of these complexes results in mixed-valency products. Transition metal chelates with tetraazaporphines, phthalocyanines, dimethylglyoximes, diphenylglyoximes, dithioacetates and other organic chelating compounds have also been disclosed (cf. Annals of the New York Academy of Sciences, Synthesis and Properties of Low-Dimensional Materials, Edit. J. S. Miller and A. J. Epstein, Vol. 313, New York 1978, pages 9 et seq., 25 et seq., 594 et seq. and 633 et seq.).

It is also known that, for example, bis-(diphenylglyoximato)-Ni(II) complexes, which have a planar structure and crystallize in stacks, can be converted, by oxidation with iodine, into the electrically conductive compound bis-(diphenylglyoximato)-Ni.I. The latter has a conductivity of $10^{-3}$–$10^{-2}$ S/cm, which is $10^8$ greater than that of the starting compound (cf. Inorg. Nucl. Chem. Lett., 10, (1974), 467). In compounds of this type, the iodide anions form polymeric chains which lie in channels between the complex stack, in the stack direction, and are surrounded by the aromatic radicals.

Other known electrically conductive products, for example polyacetylenes oxidized with iodine, have the disadvantage that they must be prepared, and handled, in the total absence of air. On contact with air, they take up oxygen very rapidly, and their conductivity drops by one or two orders of magnitude.

It is an object of the present invention to provide novel, easily prepared, electrically conductive products which have conductivities greater than $1\times10^{-3}$ S/cm and are stable to air. It is a further object to provide products of this type, which have conductivities greater than $10^{-3}$ S/cm even in powder form and not merely as highly ordered single crystals, thereby substantially increasing their usefulness and range of applications in the electrical industry.

We have found that this object is achieved, according to the invention, by employing, as the chelating compound, a 1,9-substituted phenalene of the general formula (I):

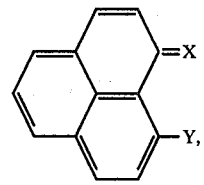

where X is O, NH, S, Se or Te and Y is OH, $NH_2$ or SH.

For the purposes of the invention, an electrically conductive products which is stable to air is regarded as a products which has a conductivity greater than $1\times10^{-3}$ S/cm, and does not decompose, and remains stable, when exposed to the atmosphere at from 0° to 100° C. The electrical conductivity is measured in S/cm at 30° C., using the method of F. Beck, Berichte Bunsengesellschaft, Physikalische Chemie 68 (1964), 558–567.

To prepare an electrically conductive product, a cation of a metal of group VII or VIII or sub-group I of the periodic table is reacted with an organic chelating compound to give a metal chelate. The metal cation is, for example, a cation of Mn, Tc, Re, Fe, Ru, Os, Co, Rh, Ir, Ni, Pd, Pt, Cu or Mg, preferably of Fe, Ni, Pd, Pt or Cu, and is employed in the form of a salt, for example a halide, halogen complex, sulfate, nitrate, phosphate, perchlorate, trifluoromethanesulfonate or acetate. Specific examples of suitable salts of this type are manganese acetate, iron(II) sulfate, cobalt(II) acetate, nickel(II) acetate, palladium(II) chloride or potassium tetrachloroplatinate(II); nickel(II) acetate is particularly suitable. The reaction of the metal salt with the organic chelating compound is preferably carried out in solution, more especially in a 1:1 ethanol-water mixture in which the salt is dissolved, the solution then being mixed with a solution of the chelating agent in ethanol. To accelerate the reaction, the mixture is advantageously heated to the boiling point of the solvent, for example of the ethanol-water mixture. Using this method of preparation, the sparingly soluble organo-metallic product precipitates from the solution and can be recrystallized from a higher alcohol, preferably n-butanol, and be isolated in an anhydrous form. In a particularly preferred embodiment, 1 mole of the organic chelating compound is dissolved in ethanol and half a mole of nickel(II) acetate, in a 1:1 ethanol/water mixture, is added dropwise at the boil, namely at 70°–80° C.; the organo-metallic chelate precipitates in high purity and good yield.

The oxidation of the organo-metallic chelate prepared by the above method is carried out with an oxidizing agent, such as $AsF_5$, $SbF_5$, $SbCl_5$, chlorine, bromine or iodine, amongst which bromine and iodine are preferred and iodine is particularly suitable, advantageously in the presence of a solvent. The preferred method is to carry out the oxidation with iodine, dissolved in an inert chlorohydrocarbon or chlorofluorohydrocarbon, at the boil, to form the product. More specifically, the chelate is reacted with a 6-fold to 10-fold excess of iodine, dissolved in one of the said inert solvents, for from several hours to several days at from +40° to +100° C.; the electrically conductive air-stable products precipitate. To achieve maximum electrical conductivity, the oxidation is preferably carried out under an inert gas, for example argon.

According to the invention, the organic chelating compounds used are 1,9-substituted phenalenes (perinaphthylenes) of the general formula (I):

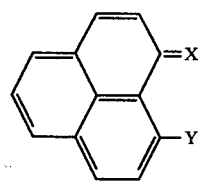

where X is O, NH, S, Se or Te and Y is OH, NH$_2$ or SH. Preferred compounds of the formula (I) are those where X is O, and a particularly preferred compound is that where X is O and Y is NH$_2$, ie. 9-amino-1-phenalenone.

The compounds of the formula (I) employed according to the invention are known per se and are described in J. Org. Chem. 44 (1979), 1,704, Tetrahedron 34 (1978), 2147 and British Pat. No. 1,388,417. The compounds (I) are completely planar aromatic C$_{13}$-hydrocarbons.

The reaction of a compound (I) with a cation of a metal of group VII or VIII or sub-group I of the periodic table, preferably with an Fe, Ni, Pd, Pt or Cu cation, and more especially with an Ni cation, first results in the bis-(chelate) metal complex of the general formula (II):

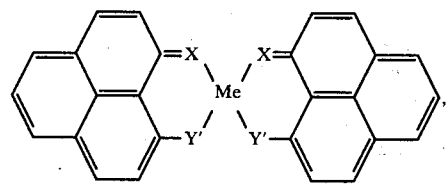

where X and Y have the above meanings, Y' is Y minus a hydrogen, and Me is a metal of the type defined at the outset. Oxidation of the chelate compound (II) results in the novel electrically conductive product of the general formula (III)

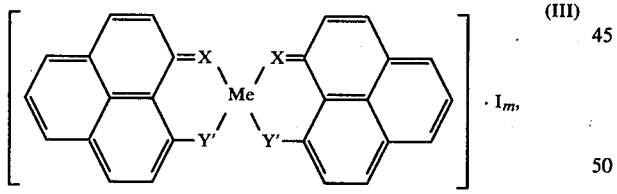

where X, Y and Me have the above meanings and m is an integer from 1 to 5. A preferred compound (III) is bis-(9-amino-1-phenalenonato)-Ni.I$_{1-5}$.

The insoluble iodinated product (III) is isolated from the iodine solution by filtration, washed with a chlorohydrocarbon or chlorofluorohydrocarbon and dried for several hours under reduced pressure.

Increases in electrical conductivity of several orders of magnitude can be achieved by the operations mentioned. The initial conductivity of the organo-metallic chelate (II) is 10$^{-12}$ S/cm, whilst the novel product (III) has a conductivity greater than 10$^{-3}$ S/cm.

The electrically conductive systems prepared according to the invention and having electrical conductivities greater than 10$^{-3}$ S/cm may be used for the antistatic treatment of plastics, for the production of solar cells, for the conversion and fixing of radiation, and for the production of electrical and magnetic switches. The treatment of compounds (II) with oxidizing agents results in p-conductors (cf. J. Chem. Education 46 (1969), (2), 82).

EXAMPLE

1. Preparation of bis-(9-amino-1-phenalenonato)-Ni(II)

0.1 mole of 9-amino-1-phenalenone is dissolved in 700 ml of ethanol and heated to the boil. A solution of 0.05 mole of Ni(II) acetate. 4H$_2$O in 100 ml of a 1:1 ethanol/H$_2$O mixture is added dropwise to the boiling solution. The ethanol-insoluble bis-(9-amino-1-phenalenonato)-Ni(II). 2H$_2$O forms instantly. Refluxing is continued for 2 hours and the substance which has precipitated is then isolated and dehydrated under reduced pressure at 50° C. Bis-(9-amino-1-phenalenonato)-Ni(II) is obtained as a blackish violet substance, in 80–90% yield. The conductivity of the product is 6.0×10$^{-13}$ S/cm.

2. Preparation of bis-(9-amino-1-phenalenonato)-Ni.I$_m$ (m=1–5)

1 g (2.23 millimoles) of bis-(9-amino-1-phenalenonato)-Ni(II) and 3.35 g of I$_2$ (13.2 millimoles) in 220 ml of CCl$_4$ are refluxed for 20–30 hours. The mixture is cooled to room temperature and the insoluble bis-(4-amino-1-phenalenonato)-Ni.I$_m$ (m=1–5) is filtered off, washed iodine-free with CCl$_4$ and dried at 50° C., and is finally kept for one day under a high vacuum.

Yield 100%, conductivity 1.3×10$^{-1}$ S/cm.

We claim:

1. A process for the preparation of electrically conductive products which are stable to air and have conductivities greater than 1×10$^{-3}$ S/cm, said process comprising: reacting, in solution, a cation of a metal selected from the group consisting of Mn, Tc, Re, Fe, Ru, Os, Co, Rh, Ir, Ni, Pd and Cu, which metal cation is employed in the form of a salt, with a 1,9-substituted phenalene of the general formula (I)

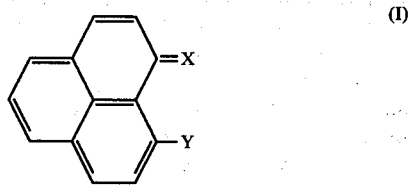

where X is O, NH, S, Se or Te and Y is OH, NH$_2$ or SH, as organic chelating compound to give a metal chelate; isolating said metal chelate from said solution, and then oxidizing the said metal chelate with an oxidizing agent selected from the group consisting of AsF$_5$, SbF$_5$, SbCl$_5$, chlorine, bromine, and iodine to form said electrically conductive product.

2. The process of claim 1 wherein the oxidizing agent is selected from the group consisting of AsF$_5$, SbF$_5$, SbCl$_5$, chlorine, bromine and iodine.

3. The process of claim 1 wherein the metal cation is employed in the form of a halide, halogen complex, sulfate, nitrate, phosphate, perchlorate, trifluoromethanesulfonate or acetate.

4. The process of claim 1 wherein a 1:1 ethanol-water mixture is used as a solvent for the process.

5. The process of claim 1 wherein the metal salt is nickel (II) acetate.

6. The electrically conductive product prepared by the process of claim 1.

* * * * *